United States Patent
Ching

(10) Patent No.: US 8,562,360 B2
(45) Date of Patent: Oct. 22, 2013

(54) CIRCUIT BOARD ASSEMBLY

(75) Inventor: Min-An Ching, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 163 days.

(21) Appl. No.: 13/191,605

(22) Filed: Jul. 27, 2011

(65) Prior Publication Data

US 2012/0171878 A1      Jul. 5, 2012

(51) Int. Cl.
*H01R 12/00*      (2006.01)

(52) U.S. Cl.
USPC ............................................................ 439/67

(58) Field of Classification Search
USPC ................. 439/67, 495, 330–331, 83, 79–80
See application file for complete search history.

(56) References Cited

U.S. PATENT DOCUMENTS

| | | | | |
|---|---|---|---|---|
| 2,233,297 | A | * | 2/1941 | Polin et al. .................. 73/304 R |
| 2,287,385 | A | * | 6/1942 | Maurer ...................... 273/118 A |
| 3,494,837 | A | * | 2/1970 | Messner et al. ............... 205/791 |
| 4,235,500 | A | * | 11/1980 | Belopavlovich et al. ..... 439/495 |
| 4,677,529 | A | * | 6/1987 | Watanabe et al. ........ 361/679.08 |
| 7,688,594 | B2 | * | 3/2010 | Muto et al. ..................... 361/749 |
| 2002/0075622 | A1 | * | 6/2002 | Robinson ...................... 361/117 |

* cited by examiner

*Primary Examiner* — Jean F Duverne
(74) *Attorney, Agent, or Firm* — Altis & Wispro Law Group, Inc.

(57) ABSTRACT

A circuit board assembly includes a circuit board, a fixing device, and at least one color-changing piece. The circuit board includes a plurality of first contacts and second contacts opposite sides of the circuit board. The fixing device includes plurality of elastic contacts. The first contacts electrically connects to the second contacts, the at least one color-changing piece is located on and are electrically connected to the corresponding first contacts or the second contacts. When the circuit board is assembled at a predetermined position of the fixing device, the second contacts are electrically connected to the elastic contacts to form and provide an electric field, and the at least one color-changing piece changes color due to the electric field.

14 Claims, 3 Drawing Sheets

CIRCUIT BOARD ASSEMBLY

BACKGROUND

1. Technical field

The disclosure generally relates to mechanical devices, and more particularly to a circuit board assembly used in an electronic device.

2. Description of the Related Art

Flexible printed circuit boards (FPCBs) are widely used in electronic devices to mechanically support and electrically connect electronic components using conductive pathways. However, in assembly, it is difficult to visually determine whether the FPCBs are positioned correctly in the electronic device, which is inefficient and can result in a low yield rate.

Therefore, there is room for improvement within the art.

BRIEF DESCRIPTION OF THE DRAWINGS

Many aspects of a circuit board assembly can be better understood with reference to the following drawings. The components in the drawings are not necessarily drawn to scale, the emphasis instead being placed upon clearly illustrating the principles of the circuit board assembly. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
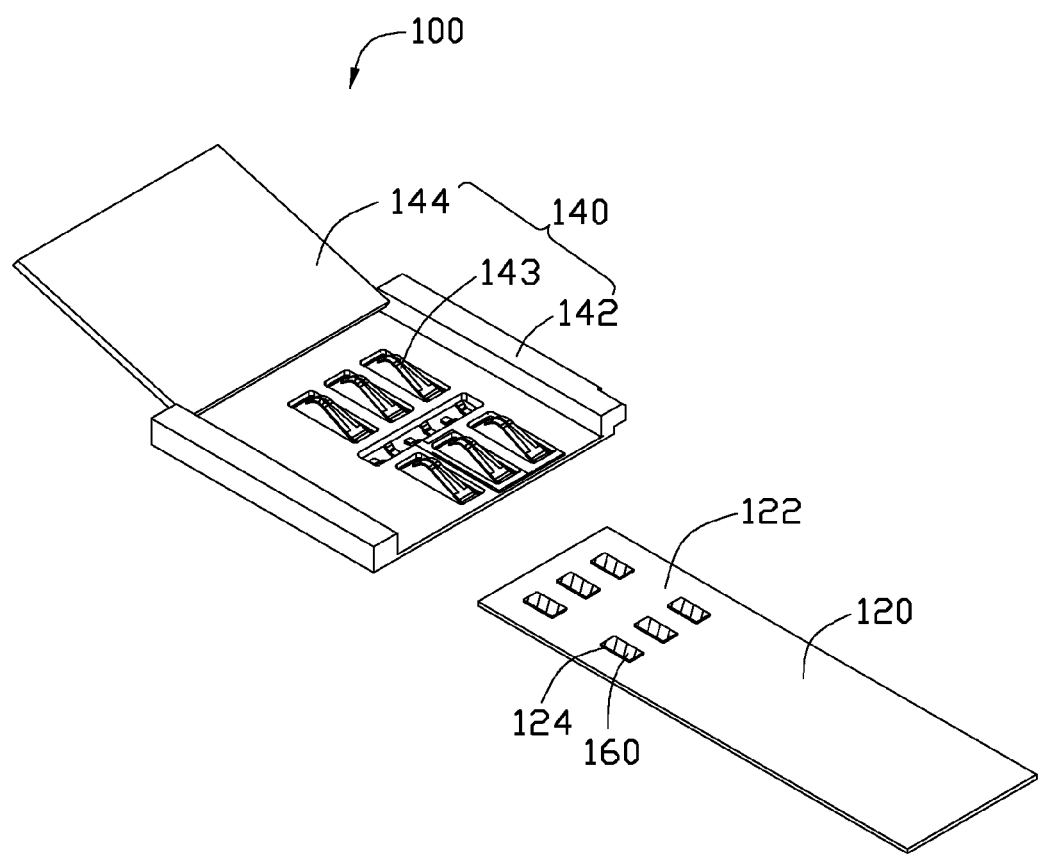
FIG. 1 is a schematic and exploded view of a circuit board assembly including a circuit board, according to one embodiment of the disclosure.

FIG. 1 shows a schematic and exploded view of a circuit board assembly 100 including a circuit board 120, according to one embodiment of the disclosure. The circuit board assembly 100 further includes a fixing device 140 electrically and mechanically connected to the circuit board 120. The circuit board 120 can be correctly positioned in an electronic device (not shown) through the fixing device 140.

Figure 2:
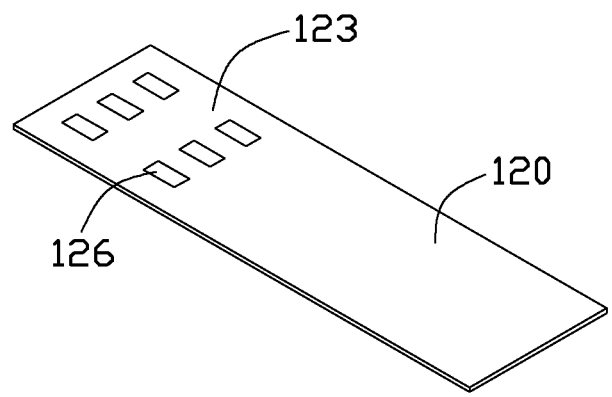
FIG. 2 is a schematic view of the circuit board shown in FIG. 1.

Referring to FIG. 2, the circuit board 120 can be a flexible printed circuit board (FPCB), and is substantially shaped as a rectangular plate. The circuit board 120 is designed to mechanically support and electrically connect electronic components using conductive pathways. The circuit board 120 includes a first surface 122 and a second surface 123 substantially parallel to the first surface 122. The circuit board 120 further includes a plurality of first contacts 124 and a plurality of second contacts 126.

The first contacts 124 are arranged and located on the first surface 122, and the second contacts 126 are arranged and located on the second surface 123 at positions corresponding to the positions of the first contacts 124. The first contacts 124 and the second contacts 126 are electrically connected to the conductive pathways of the circuit board 120. Each first contact 124 is aligned with and is electrically connected to the corresponding second contact 126.

The fixing device 140 is to be fixed in the electronic device and is configured for securing and receiving the circuit board 120 in the electronic device. The fixing device 140 includes a main body 142, a plurality of elastic contacts 143, and a cover 144. The main body 142 is substantially shaped as a rectangular frame. The elastic contacts 143 are made from copper, steel or other metals, and are located on the main body 142. Each elastic contact 143 is aligned with the corresponding second contact 126 of the circuit board 120 and when the fixing device 140 is fixed within the electronic device, the elastic contacts 143 are placed in electrical contact with the circuits of the electronic device. Thus, when the circuit board 120 is received within the fixing device 140 and the fixing device 140 is fixed within the electronic device, the second contacts 126 of the circuit board 120 are electrically connected to the circuitry of the electronic device through the elastic contacts 143. The cover 144 is a substantially shaped as a rectangular plate and is mechanically connected to the main body 142 by means such as a hinge to hold and secure the circuit board 120 within the fixing device 140.

The circuit board assembly 100 further includes a plurality of color-changing pieces 160. Each color-changing piece 160 corresponds to one of the first contacts 124 of the first surface 122. The color-changing pieces 160 are fixed and pasted on their corresponding first contacts 124 of the first surface 122 using, for example, pressure-sensitive adhesives or thermosetting adhesives.

Each of the color-changing pieces 160 is made from electrochromic material and is capable of producing electrochemical redox reaction under the action of an electric field, and so stably and reversibly change colors. The color conversion time (e.g., color fading time or coloration time) of the color-changing pieces 160 is less than 250 milliseconds; the drive current for color conversion can be less than 6 uA/cm$^2$.

In this embodiment, the electrochromic material can be anodizing coloring material, such as NIO, $IrO_2$ or $Fe[Fe(CN)_6]_3$, cathodic reduction coloring material, such as $WO_3$, $MnO_3$, $Nb_2O_3$ or $TiO_3$, or anodizing/cathodic reduction coloring material, such as $V_2O_5$, CoO or $Rh_2O_3$.

Figure 3:
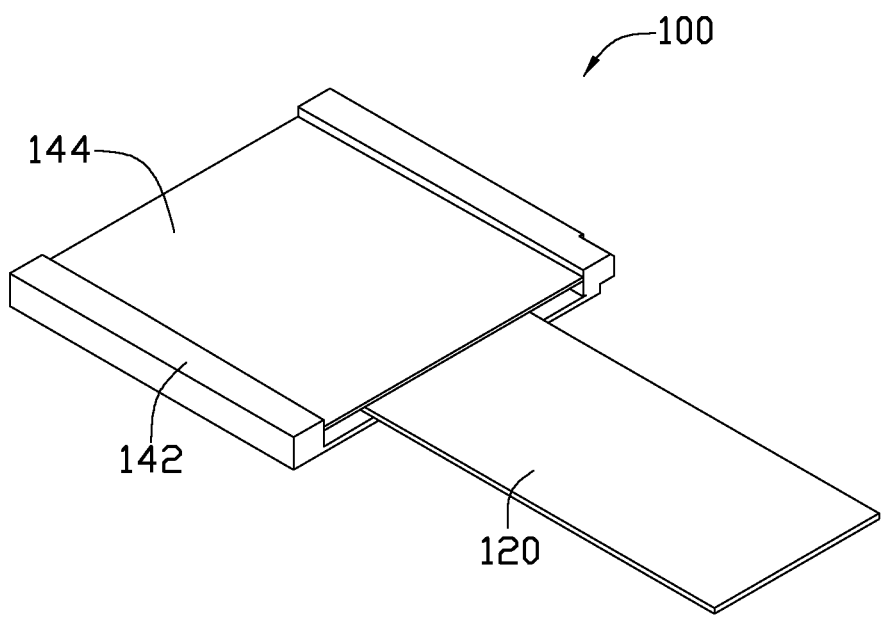
FIG. 3 is a schematic and assembled view of the circuit board assembly shown in FIG. 1 of this disclosure.

Referring to FIGS. 1, 2, and 3, in assembly, the circuit board 120 is inserted into the fixing device 140, which has been previously placed into electronic connection with the circuitry of the electronic device. If the circuit board 120 is correctly positioned, that is, the second contacts 126 are aligned with and electrically contacting their corresponding metal elastic contacts 143, an electric field for controlling the color-changing pieces 160 is produced. Thus, the color-changing pieces 160 on the first contacts 124 reversibly change color, indicating that circuit board 120 is properly positioned relative to the fixing device 140. The cover 144 is then rotated to hold and secure the circuit board 120 in the fixing device 140. Thus, the circuit board 120 is assembled at the predetermined position relative to the fixing device 140. If at least one of the color-changing pieces 160 fails to change color, then that signifies that the circuit board 120 is not correctly positioned relative to the fixing device 140 and needs to be readjusted.

The numbers of the color-changing pieces and contacts can not be limited, and the color-changing pieces 160 can be attached to the corresponding second contacts 126 using thermosetting adhesives or pressure-sensitive adhesives. Thus, when all the color-changing pieces 160 change their color, the circuit board 120 is correctly positioned.

In summary, in the circuit board assembly 100 of the disclosure, the color-changing pieces 160 are arranged on the circuit board 120. Thus, when the circuit board 120 is assembled to the fixing device 140 at the predetermined position, the color-changing pieces 160 will change color, which is easily and quickly verifiable by a worker.

In the present specification and claims the word "a" or "an" preceding an element does not exclude the presence of a plurality of such elements. Further, the word "comprising" does not exclude the presence of other elements or steps than those listed.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A circuit board assembly comprising:
   a circuit board for supporting electronic components, the circuit board comprising:
   a plurality of first contacts located at one side of the circuit board; and
   a plurality of second contacts located at the other side of the circuit board, each second contact electrically connected to a corresponding one of the first contacts;
   a fixing device for holding and securing the circuit board, the fixing device comprising a plurality of elastic contacts; and
   at least one color-changing piece, wherein the color-changing pieces are located on and are electrically connected to the first contacts or the second contacts, when the circuit board is assembled at a predetermined position relative to the fixing device, the contacts connected to the color changing pieces are correspondingly electrically connected to the elastic contacts to form an electric field that changes the color of the color-changing pieces;
   wherein the circuit board is a flexible printed circuit board, the circuit board further comprises a first surface and a second surface parallel to the first surface, the first contacts are arranged and located on the first surface, the second contacts are arranged and located on the second surface at positions corresponding to the positions of the first contacts, and the first contacts and the second contacts are electrically connected to conductive pathways of the circuit board.

2. The circuit board assembly as claimed in claim 1, wherein the at least one color-changing pieces is fixed and pasted on their corresponding first contacts of the first surface using pressure-sensitive adhesives or thermosetting adhesives.

3. The circuit board assembly as claimed in claim 1, wherein the at least one color-changing pieces is attached to their corresponding second contacts of the second surface using thermosetting adhesives or pressure-sensitive adhesives.

4. The circuit board assembly as claimed in claim 1, wherein each of the color-changing pieces is made from electrochromic material and is capable of producing electrochemical redox reaction under the action of electric field, and further generating and displaying stable and reversible color change.

5. The circuit board assembly as claimed in claim 4, wherein the electrochromic material is NIO, IrO2, Fe[Fe(CN)6]3, WO3, MnO3, Nb2O3, TiO3, V2O5, CoO or Rh2O3.

6. The circuit board assembly as claimed in claim 4, wherein the color fading time and coloration time of the at least one color-changing pieces is less than 250 milliseconds, and the drive current of color conversion is less than 6 uA/cm2.

7. The circuit board assembly as claimed in claim 1, wherein the fixing device further comprises a main body and a cover, the elastic contacts are located on the main body, the cover is mechanically connected to the main body using a hinge to hold and secure the circuit board.

8. A circuit board assembly comprising:
   a circuit board comprising a plurality of first contacts located at one side of the circuit board; and
   a fixing device holding and securing the circuit board, the fixing device comprising a plurality of metal elastic contacts, each metal elastic contact corresponding to one of the first contacts;
   wherein the at least one first contact is coated by electrochromic material, and when the circuit board is received within the fixing device at a predetermined position, the first contacts are aligned with and electrically connected to their corresponding metal elastic contacts to form and provide an electric field that changes the color of the electrochromic material; and
   wherein the circuit board is a flexible printed circuit board, the circuit board further comprises a plurality of second contacts, a first surface and a second surface parallel to the first surface, the first contacts are arranged and located on the first surface, the second contacts are arranged and located on the second surface at positions corresponding to the positions of the first contacts, and the first contacts and the second contacts are electrically connected to conductive pathways of the circuit board.

9. The circuit board assembly as claimed in claim 8, wherein the electrochromic materials are fixed and pasted on their corresponding first contacts of the first surface using pressure-sensitive adhesives or thermosetting adhesives.

10. The circuit board assembly as claimed in claim 8, wherein the electrochromic materials are attached to their corresponding second contacts of the second surface using thermosetting adhesives or pressure-sensitive adhesives.

11. The circuit board assembly as claimed in claim 8, wherein the electrochromic material are capable of producing electrochemical redox reaction under the action of electric field, and further generating and displaying stable and reversible color change.

12. The circuit board assembly as claimed in claim 11, wherein the electrochromic material is any one of NIO, IrO2, Fe[Fe(CN)6]3, WO3, MnO3, Nb2O3, TiO3, V2O5, CoO or Rh2O3.

13. The circuit board assembly as claimed in claim 11, wherein the color conversion time of the at least one color-changing pieces is less than 250 milliseconds, and the drive current of color conversion is less than 6 uA/cm2.

14. The circuit board assembly as claimed in claim 8, wherein the fixing device further comprises a main body and a cover, the elastic contacts are located on the main body, the cover is mechanically connected to the main body using a hinge to hold and secure the circuit board.

* * * * *